United States Patent [19]

Clark

[11] Patent Number: 5,422,804
[45] Date of Patent: Jun. 6, 1995

[54] GROUND LOOP ELIMINATION

[76] Inventor: George E. Clark, 1900 Alta W. Rd., Mansfield, Ohio 44903

[21] Appl. No.: 945,092

[22] Filed: Sep. 15, 1992

[51] Int. Cl.[6] .............................................. H02M 1/14
[52] U.S. Cl. ..................................... 363/44; 363/126
[58] Field of Search ........................... 363/40, 125, 126

[56] References Cited

U.S. PATENT DOCUMENTS

| | | | |
|---|---|---|---|
| 3,668,465 | 6/1972 | Evans et al. | 315/107 |
| 3,939,363 | 2/1976 | Engel | 307/202 |
| 4,085,431 | 4/1978 | Chikatsu | 361/56 |
| 4,091,432 | 5/1978 | Muller | 361/56 |
| 4,109,306 | 8/1978 | Mason | 363/126 |
| 4,219,872 | 8/1980 | Englemann | 363/126 |
| 4,321,644 | 3/1982 | Brasfield | 361/56 |
| 4,471,423 | 9/1984 | Hase | 363/126 |
| 4,555,751 | 11/1985 | Koga et al. | 363/44 |
| 4,586,104 | 4/1986 | Standler | 361/91 |
| 4,616,286 | 10/1986 | Breece | 361/56 |
| 4,630,162 | 12/1986 | Bell et al. | 361/56 |
| 4,661,878 | 4/1987 | Brown et al. | 361/56 |
| 4,675,772 | 6/1987 | Epstein | 361/56 |
| 4,677,518 | 6/1987 | Hershfield | 361/56 |
| 4,819,145 | 4/1989 | Maeba | 363/126 |
| 4,903,186 | 2/1990 | Pullen | 363/126 |
| 4,922,365 | 5/1990 | Mori | 361/18 |
| 5,172,308 | 12/1992 | Tohya | 363/126 |

Primary Examiner—Jeffrey L. Sterrett
Attorney, Agent, or Firm—Jerry Semer

[57] ABSTRACT

The inventor has created several methods to eliminate or greatly reduce the ground loop problem. The inventor has discover that ground loop distortion is caused by the switching from positive to negative in alternating current. He has designed several devices to eliminate this problem. In his first embodiment he places a set of two diodes either cathode to cathode or anode to anode in parallel with all the capacitors in an amplifier or other electronic device. These sets of diodes eliminate the ground loop distortion within the amplifier or electronic device. One can also use neon bulbs or piezoelectric crystals in parallel with all the capacitors in an amplifier or electronic device to reduce the ground loop distortion. The applicant has also devises several power supply that eliminate or greatly reduce the ground loop distortion in an amplifier or electronic device they are attached to. Also the applicant has found that by attaching two diodes either anode to anode or cathode to cathode between an audio, video or digital cable and its ground will reduce distortion within the cable. One can also use piezoelectric crystals or neon bulbs in place of the diodes to reduce the distortion in the circuit. The applicant has found that his invention not only reduces and eliminate the ground loop distortion in audio and video circuits and cables but also allows digital circuits to work at a much higher speed due to the eliminating of this distortion.

10 Claims, 16 Drawing Sheets

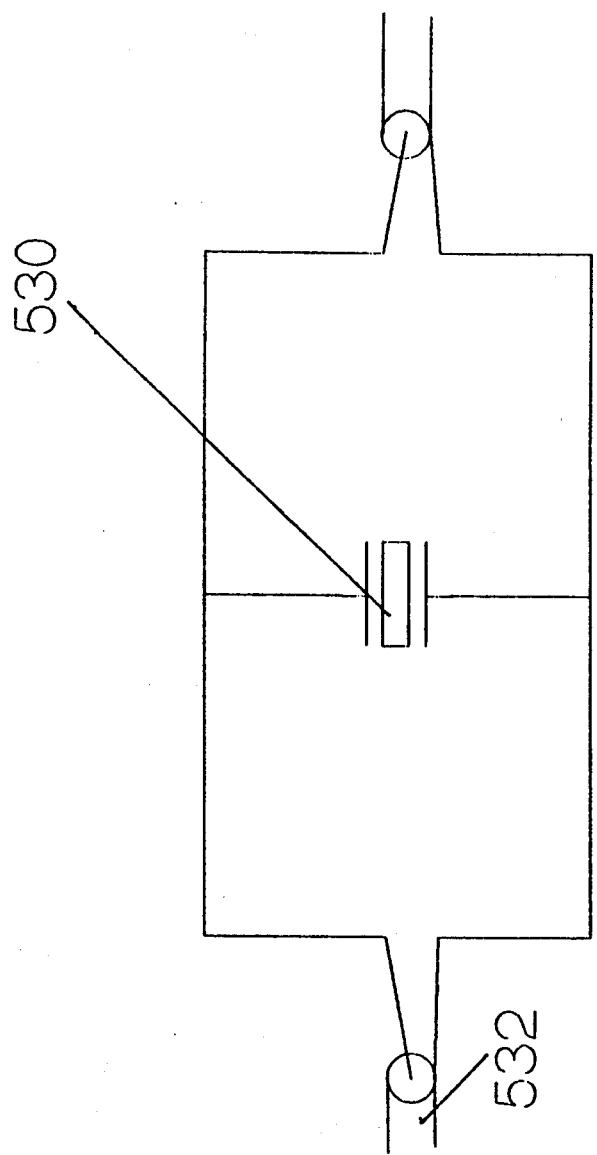

GROUND LOOP ELIMINATION

FIELD OF INVENTION

The present invention relates to a device that eliminates crossover distortion and more particularly to a device that solves the ground loop flow problem.

BACKGROUND OF THE INVENTION

All devices which need current for operation have, up until the time of this invention, an unsolved ground loop problem. It usually consists of varying ghost images or cross over distortion. The usual method of ridding the system of distortion is by filtering the end product. This is like closing the barn door after the cattle have escaped. The inventor's remedy stops the problem distortion at the source by eliminating the ground loop problem with his invention. Thusly, the object of this invention is to eliminate the ground loop problem. Further, the object of this invention is to greatly reduce the distortion of any electronic device by eliminating the ground loop problem. The invention that achieved this elimination of the ground loop problem is a unique circuit that consists of diodes, piezoelectric crystals, neon bulbs, or transient surge suppressors. The advantage of the inventor's system is that distortion, the power consumption, and the unwanted heating of the device to which the invention is connected, is greatly reduced.

SUMMARY OF INVENTION

The inventor has created several methods to eliminate or greatly reduce the ground loop problem. The inventor has discover that ground loop distortion is caused by the switching from positive to negative in alternating current. He has designed several devices to eliminate this problem. In his first embodiment, he places a set of two diodes, either cathode to cathode or anode to anode in parallel with all the capacitors in an amplifier or other electronic device. These sets of diodes eliminate the ground loop distortion within the amplifier or electronic device. One can also use neon bulbs or piezoelectric crystals in parallel with all the capacitors in an amplifier or electronic device to reduce the ground loop distortion. The applicant has also devised several power supplies that eliminate or greatly reduce the ground loop distortion in an amplifier or electronic device they are attached. Also, the applicant has found that by attaching two diodes either anode to anode or cathode to cathode, between an audio, video or digital cable and its ground will reduce distortion within the cable. One can also use piezoelectric crystals or neon bulbs in place of the diodes to reduce the distortion in the circuit. The applicant has found that his invention not only reduces and eliminates the ground loop distortion in audio and video circuits and cables but also allows digital circuits to work at a much higher speed due to the elimination of this distortion.

DESCRIPTION OF THE DRAWINGS

FIG. 18 is a schematic drawing of a cable with piezoelectric crystals attached between a cable and the cable's ground.

DETAILED DESCRIPTION OF THE PREFERRED EMBODIMENT

Figure 1:
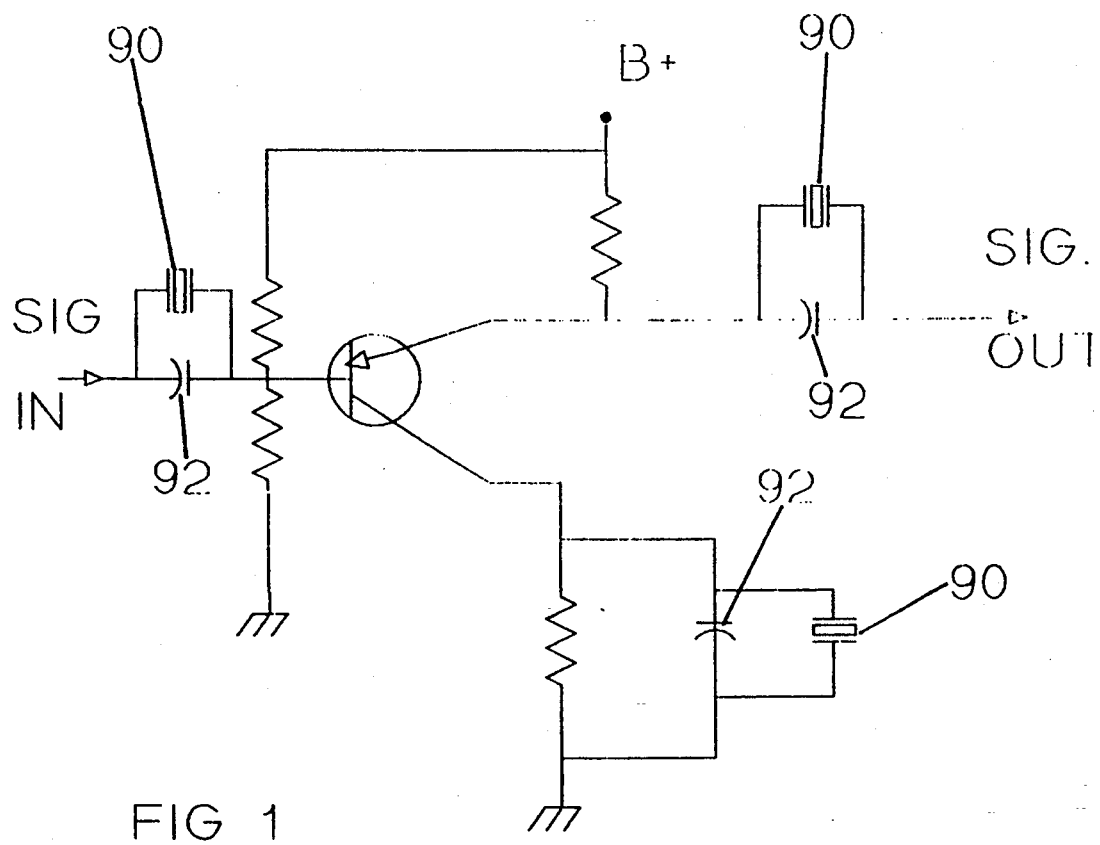
FIG. 1 is a schematic drawing of an amplifier with piezoelectric crystals in parallel with all the capacitors.
Figure 2:
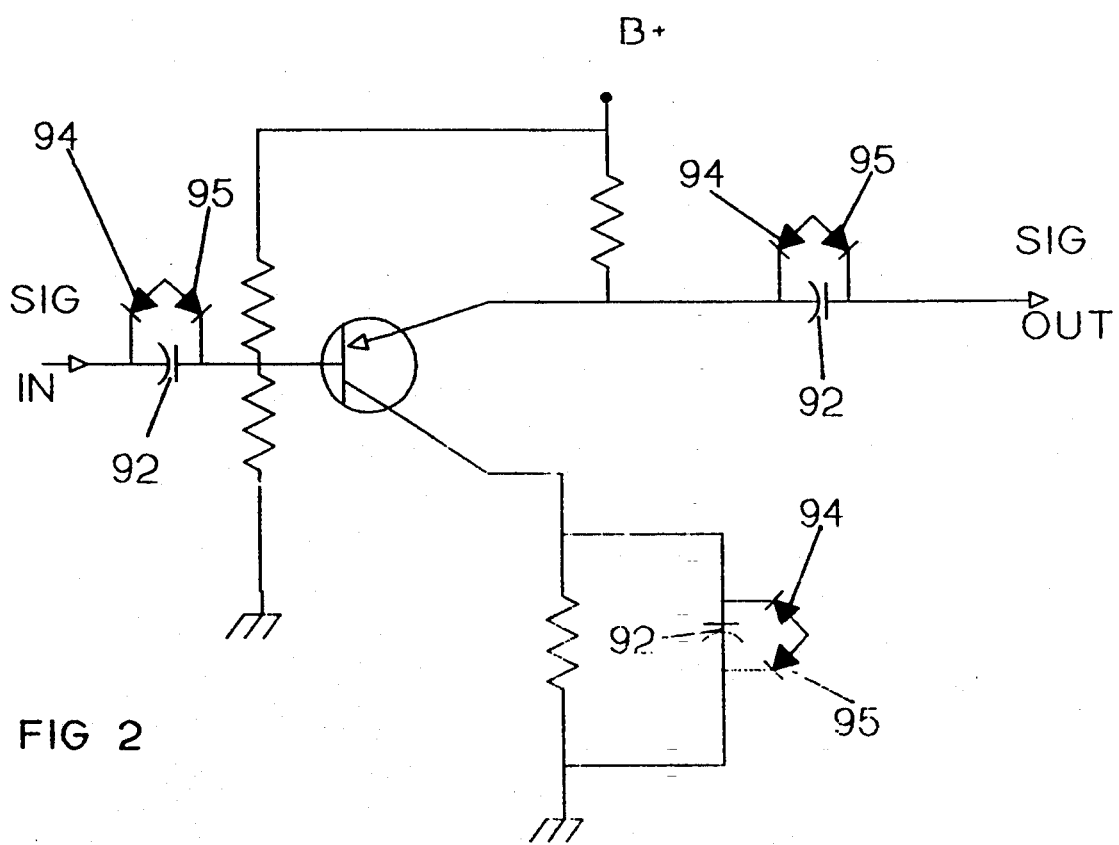
FIG. 2 is a schematic drawing of an amplifier with diodes and parallel with all the capacitors.
Figure 3:
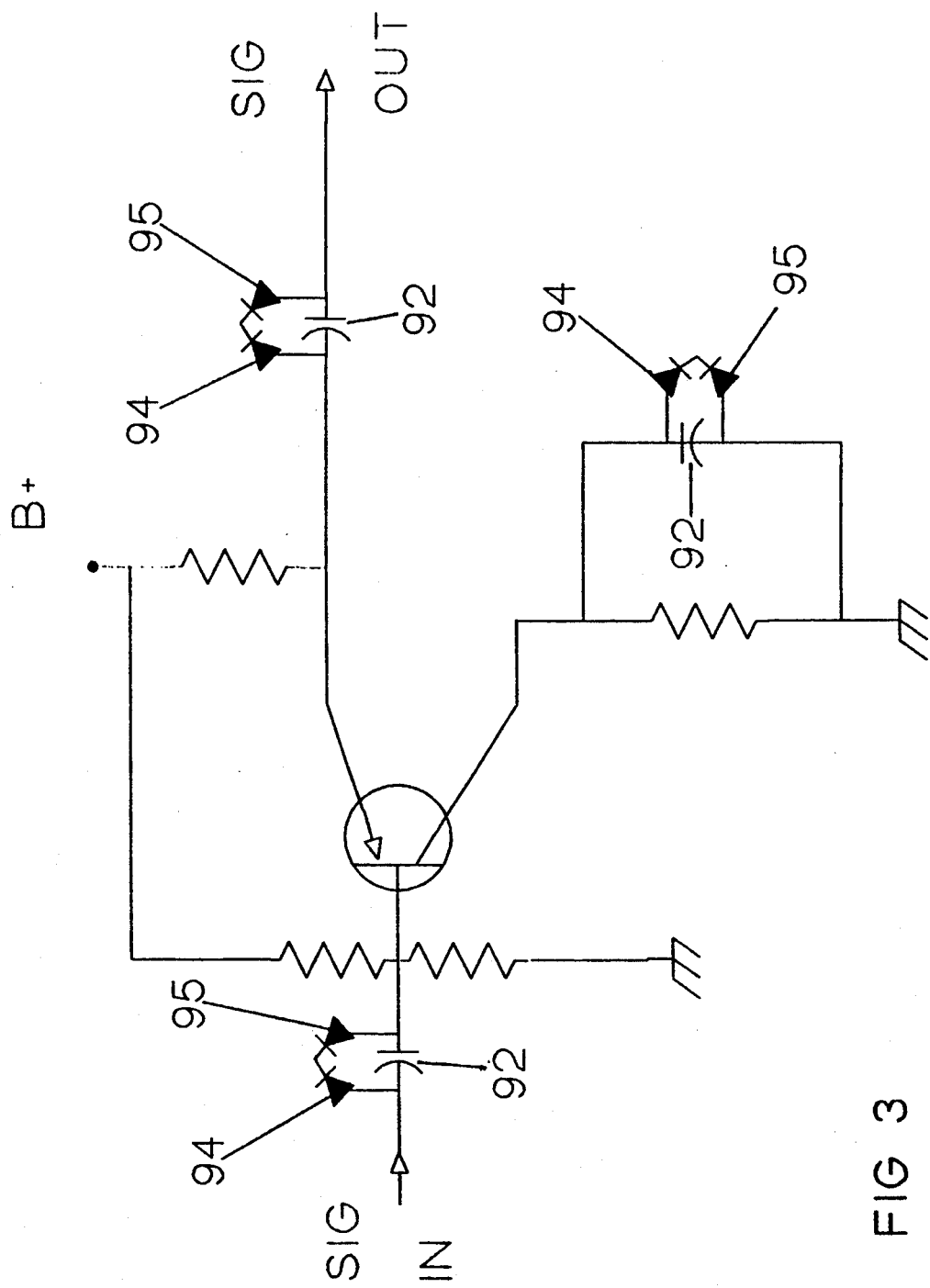
FIG. 3 is a schematic drawing of another embodiment of an amplifier with diodes in parallel with all the capacitor.
Figure 4:
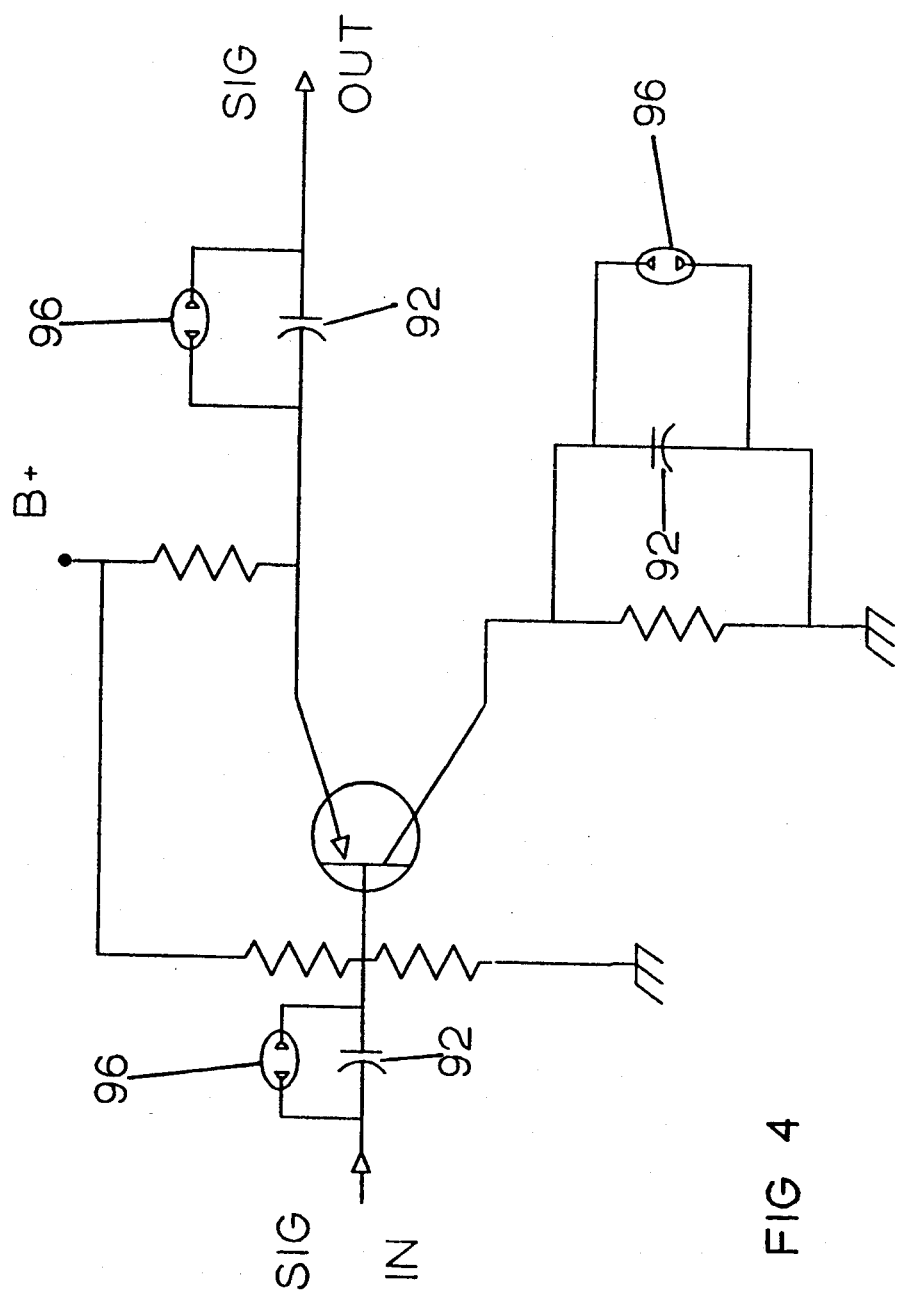
FIG. 4 shows a schematic drawing of an amplifier with neon bulbs in parallel with all the capacitors.

Reference is now made to the figures. The figures in all like parts are represented by like reference numerals. FIG. 1 shows one of the inventor's embodiment for elimination of the ground loop problem. In this embodiment piezoelectric crystals 90 are attached in parallel with each of the capacitors 92 in the simple transistor amplifier. However, the principle of attaching piezoelectric crystals in parallel with capacitors can be used in any amplifier or electronic device. In these devices, the piezoelectric crystals attached in parallel to capacitors will help eliminate the ground loop problem. FIG. 2 and 3 show that the piezoelectric crystals can be replaced with a diodes 94 and 95 attach anode to anode as in FIG. 2 or cathode to cathode as in FIG. 3. The applicant has found that these diodes 94 and 95 attach anode to anode and cathode to cathode when attached in parallel across all the capacitors in an amplifier or electronic device is the best method for elimination of the ground loop problem. The applicant has found that piezoelectric crystals with a resonate frequency of 400 kilohertz or less, which are attached to all the capacitors in the electronic device or amplifier works almost as well as the diodes attached in parallel across all the capacitors. As shown in FIG. 4 neon bulbs 96 can also be used. These neon bulbs 96 are as the diodes 94 and 95 and the piezoelectric crystals 90, attached in parallel across the capacitor in an amplifier or electronic device. The neon bulbs work better then the piezoelectric crystals in eliminating ground loop distortion, but not nearly as well as the diodes.

Figure 5:
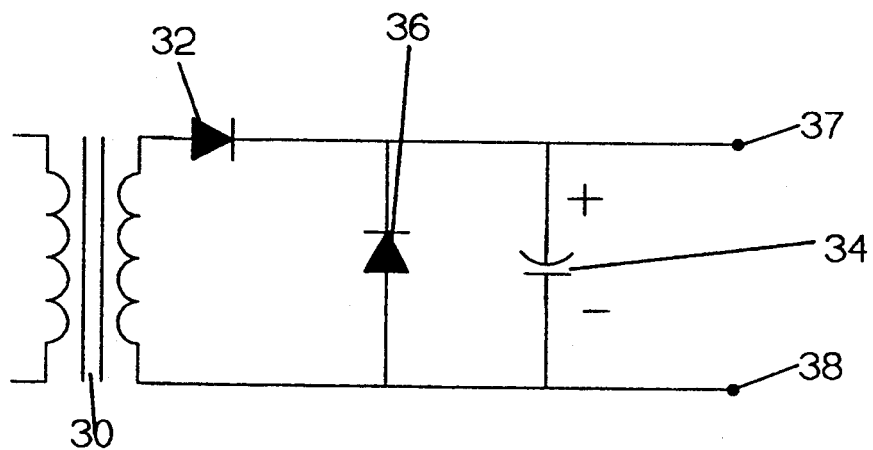
FIG. 5 is a schematic drawing of a power supply of the invention.
Figure 6:
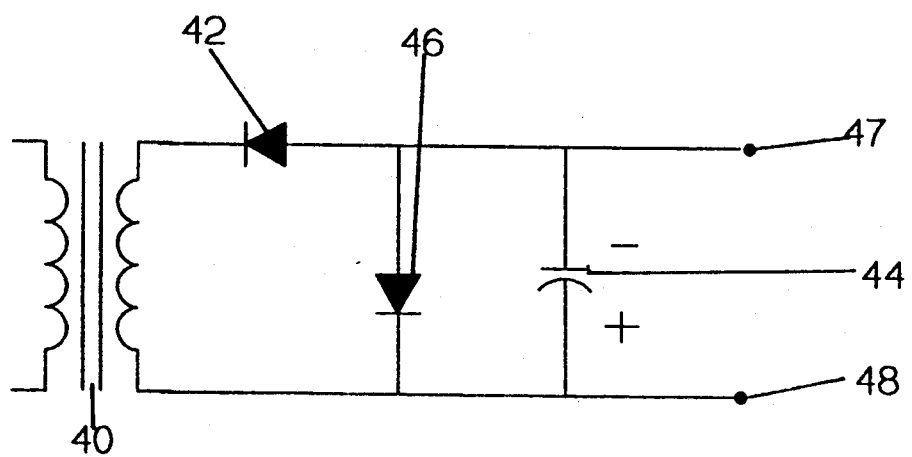
FIG. 6 is a schematic drawing of another embodiment of a power supply of the invention.

However, due to the complexity of putting the piezoelectric crystals, neon bulbs or diodes across all of the capacitors the applicant has produce several other embodiments that are power supplies which reduce or eliminate the ground loop problem. FIG. 5 and FIG. 6 shows the ways of modifying a half wave rectifier power supply. Basically with this design a diode is placed across the output lines beyond the regular half wave rectifier diode. In, FIG. 5 diode 32 is the diode of the regular half wave of the rectifier. Diode 36 is then put across the output lines, with its positive end hooked to the positive output 37 and its negative end hooked to the negative output 38 in the circuit. Diode 36 is hooked across the output lines with it positive end to the positive end of Diode 32. An electrolytic capacitor is hooked to the two outputs, 37 and 38 of the power supply. In FIG. 6, diode 42, which is he diode of a regular half wave rectifier is placed in the circuit in the opposites direction of diode 32. In this case, diode 46 is placed in the circuit to eliminate the ground loop problem and is placed across the output lines 47 and 48 with its negative end attached to the negative end of diode 42. The positive end of diode 46 is attached to the positive output 48 and the negative end is attached to the negative output 47. Capacitor 44 is attached across the two outputs 47 and 48. By attaching this extra diode, these power supplies will eliminate the ground loop problem in the electronic device.

FIG. 7 through 14 shows embodiment and power supplies that eliminate the ground loop problem.

Figure 7:
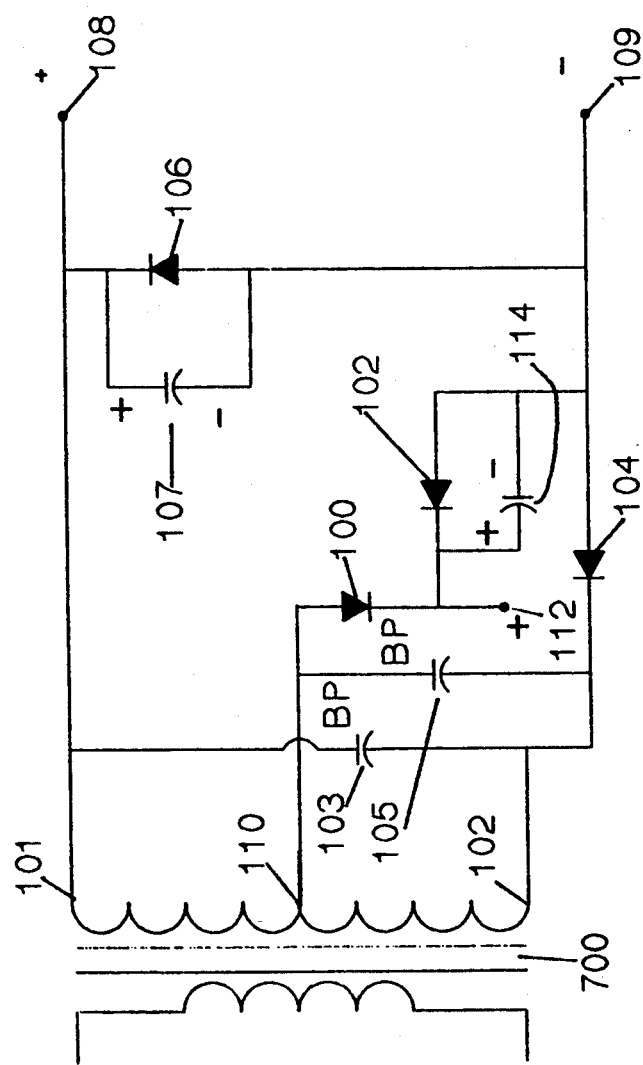
FIG. 7 is a schematic drawing of another embodiment of a power supply of the invention.
Figure 8:
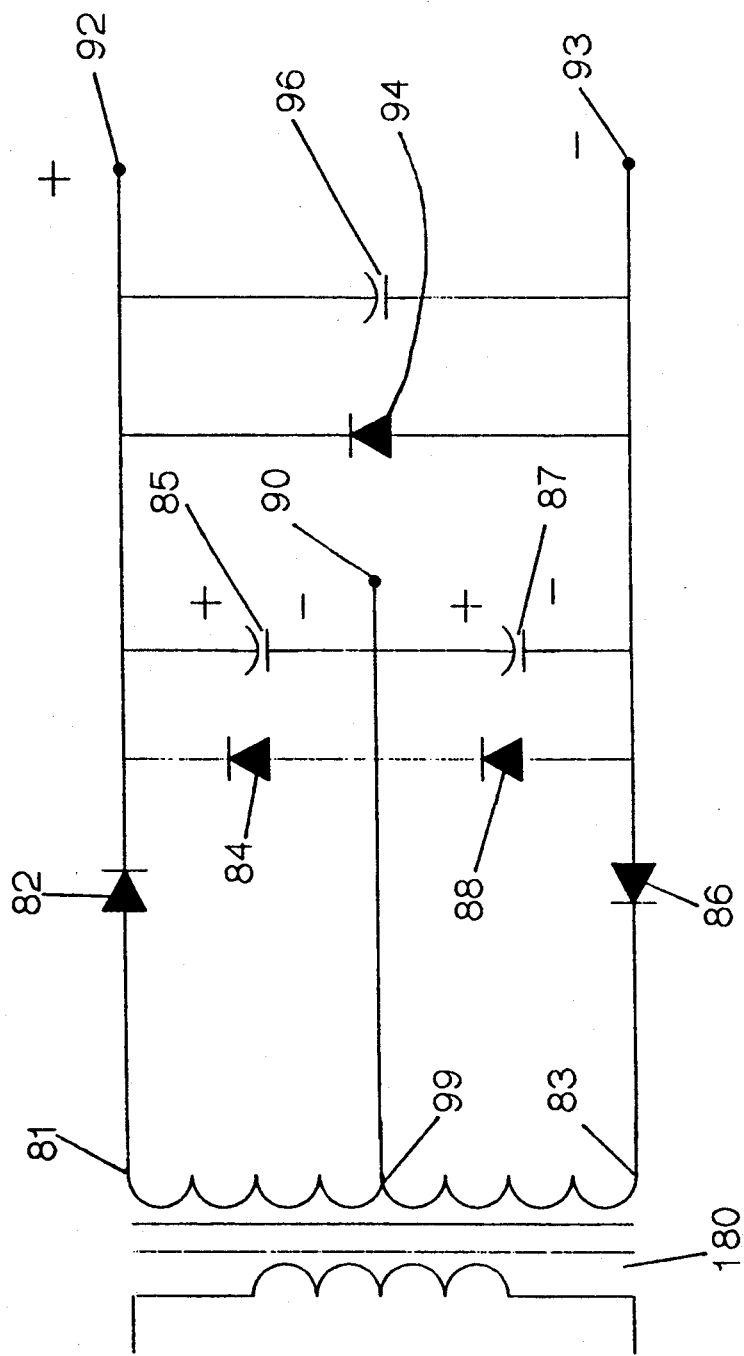
FIG. 8 is a schematic drawing of another embodiment of a power supply of the invention.

FIG. 7 shows a center tap transformer 100 with two output 101 and 102 and center tap 110. Across the outputs 101 and 102 is a bipolar capacitor 103. Across the center tap 110 and output 102 is another bipolar capacitor 105. The negative end of diode 100 is attached to capacitor 105 and the center tap 110. The positive end of diode 100 is attached to one of the positive output, 112, of this power supply. Positive output 112 is also attached to the positive end of diode 102 and electrolyte capacitor 114. The positive end of diode 102 is also attached to the positive end of 100. Diode 102 negative end is attached to the negative end of diode 104, and the negative end of diode 106, the negative ends of electrolytic capacitors 114 and 107, and the negative output 109 of this power supply. Diode 104 positive end is attached to transformer 100 output 102 and bipolar capacitor 103 and 105. Diode 104 negative end is attached to the negative output 109, and the negative ends of diodes 106 and 102, and the negative ends of electrolytic capacitors 114 and 107. Diode 106 is ran between one of the positive outputs of this power supply 108 and the negative output of this power supply 109. The negative end of 106 is attached to the negative output 109 and the positive end of diode 106 is attached to the output 108. An electrolytic capacitor 107 is attached with it negative end to the negative end of diode 106 and its positive end of the positive end of diode 106. This power supply will greatly reduce distortion in the final output of an auto/video device attached to it. The power supply will also cut down on distortion in digital circuits that are attached to it and it also increases the speed in which digital circuits can be switch as well as lowering the power consumption of most circuits. Of the full wave bridge rectifier circuits, this circuit does the best eliminating distortion and allows video, audio and digital circuits to work more efficiently. FIG. 8, 9, 10, and 11 show four other embodiments of this invention that work almost as well as FIG. 7. FIG. 8 shows a center tap transformer 180 with out puts 81 and 83 and center tap 95. Output 81 is attached to the negative end of diode 82. Diode 82 positive end is attached to the positive output 92 of this power supply and to the positive end of diode 84 and the positive end of electrolytic capacitor 85. Diode 84 is attached across the positive output 92 and the center tap 95. Diode 84 negative end is attached to center tap 95 and its positive end is attached to the positive end of diode 82. The positive end of diode 90 and the positive output 92. Capacitor 85 is ran in parallel to diode 84 and is attached to the positive output 92 and the positive ends of diode 82, 84 and 90. Electrolytic capacitor 85 negative end is attached to the center tap 95 and the negative ends of diode 84 and the positive end of diode 88 and the positive end of electrolytic capacitor 87. The center tap 95 is attached to the negative end of diode 84 and the positive end of diode 88 and the negative end of electrolytic capacitor 85 and the positive end of electrolytic capacitor 87. The center tap also forms a zero reference or ground output 94 for the power supply. Attached to transformer output 83 is the positive end of diode 86. Diode 86 negative end is attached to the negative end of diode 88 the negative end of capacitor 87 the negative end of diode 90 and the negative output 93. Diode 86 negative end is also attached to capacitor 91. Diode 90 is ran between the positive output 92 and the negative output 93. With its positive end attached to the positive output 92 and the negative end of diode 90 attached to the negative output 93. A capacitor 91 is ran in parallel to diode 90 and attaches to the positive output 92 and the negative output 93.

Figure 9:
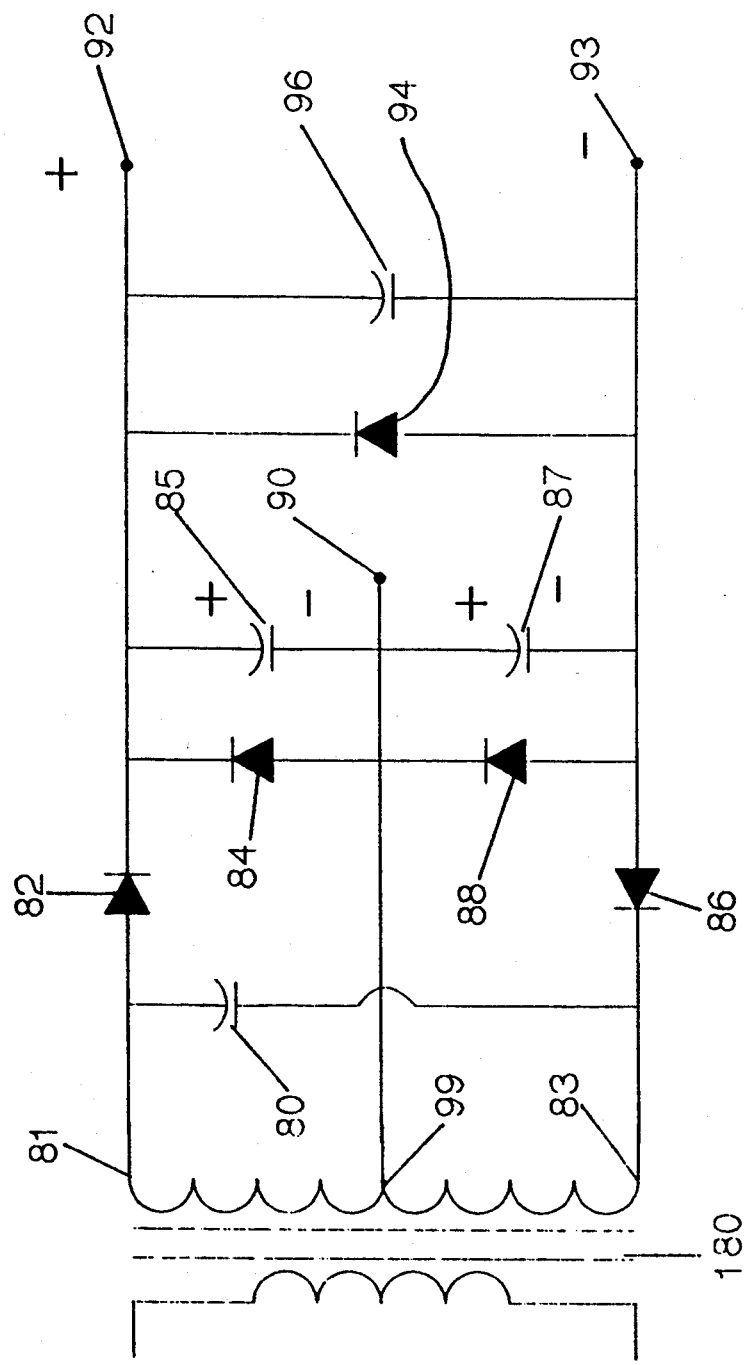
FIG. 9 is a schematic drawing of another embodiment of a power supply of the invention.

Another embodiment of this design is shown in FIG. 9. However, in this figure a bipolar capacitor 80 is attached in parallel to the transformer output 81 and 83 and to the negative end of Diode 82 and the positive end of diode 86.

Figure 10:
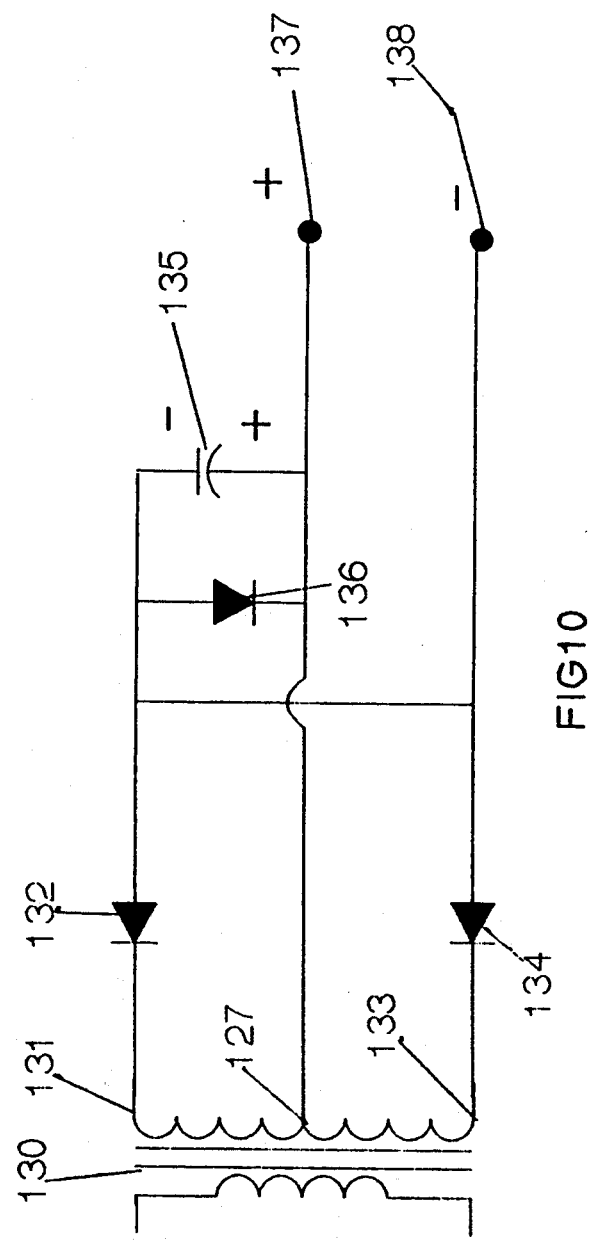
FIG. 10 is a schematic drawing of another embodiment of a power supply of the invention.

FIG. 10 shows another embodiment of this invention as it relates to power supply with the center tap transformers. FIG. 10 shows center tap transformer 130 with outputs 131 and 133 and center tap 127. Output 131 is attached to the positive end of diode 132. Diode 132 negative end is attached to the negative end of diode 134 the negative end of diode 136 and the negative end of electrolytic capacitor 135. Diode 136 negative end is attached to the negative end of diode 134 the negative end of diode 132 and the negative end of electrolyte capacitor 135. Diode 136 positive end is attached to the center tap 127 and to the positive end of electrolytic capacitor 135 and to the positive output 137 of the power supply. Capacitor 135 is an electrolytic capacitor with its negative end attached to the negative end of diode 132 and diode 136 and diode 134 its positive end attached to the positive end of diode 136 the center tap and 127 and the positive output 137. Diode 134 positive end is attached to the output 137 of the transformer 130. Diode 134 negative end is attached to the negative end of diode 132, diode 136, and the negative end of capacitor 135 and the negative output of the power supply 138.

Figure 11:
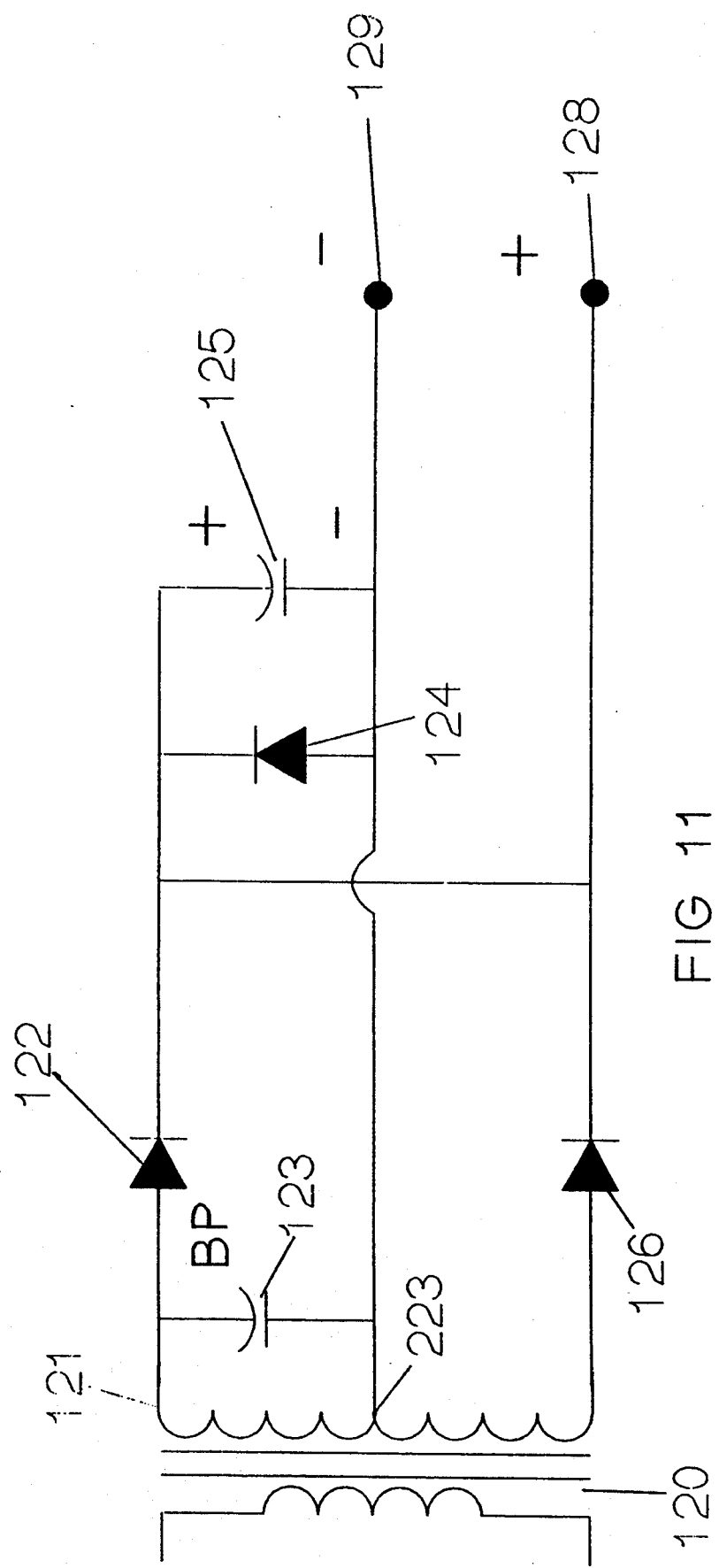
FIG. 11 is a schematic drawing of another embodiment of a power supply of the invention.

FIG. 11 shows another embodiment of the invention. However, in this embodiment the diodes are actually in reverse and a bipolar capacitor 123 is attached between one of the output of the transformer and the center tap before the first diode on the output of transformer. In FIG. 11 transformer 120 has output 121 and 222 and center tap 223. The negative end of diode 122 is attached to output 121 and bipolar transformer 123. The positive end of diode 122 is attached to the positive end of diode 124 and the positive end of diode 126 and the positive end of capacitor 125. The positive end of diode 124 is attached to the positive end of diode 126 the positive end of diode 122 and the positive end of the capacitor 125. The negative end of diode 124 is attached to the center tap bipolar capacitor 123 and the negative end of diode 125 and the negative output of the power supply. The negative end of diode 126 is attached to transformer 120 output 222. The positive end of diode 126 is attached to the positive output of the power supply, the positive ends 122 and 124 and the positive end of capacitor 125.

Figure 12:
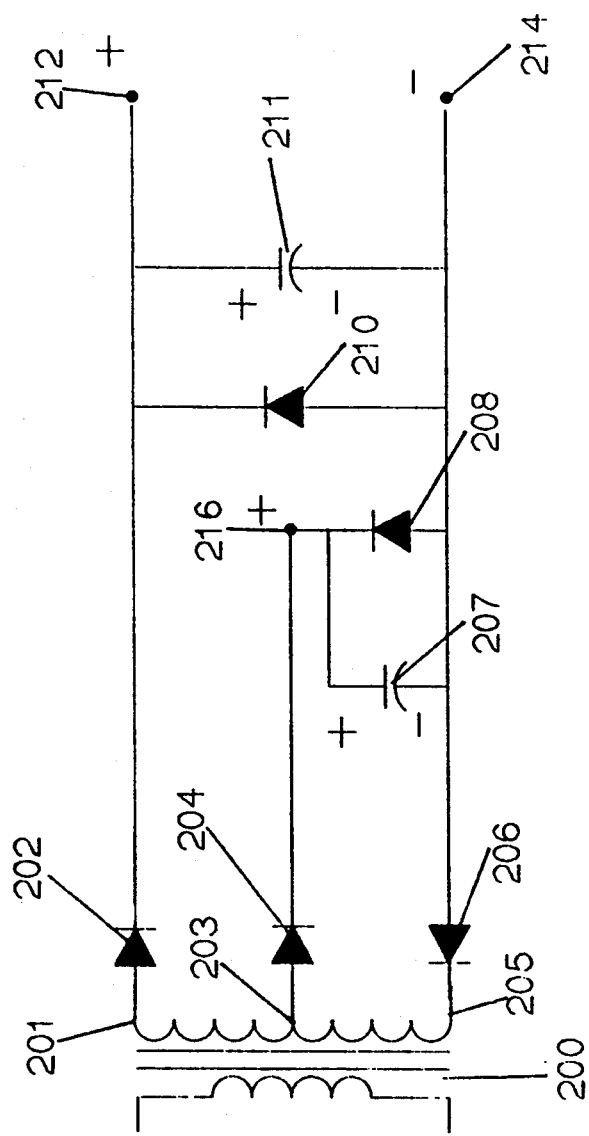
FIG. 12 is a schematic drawing of another embodiment of a power supply of the invention.
Figure 13:
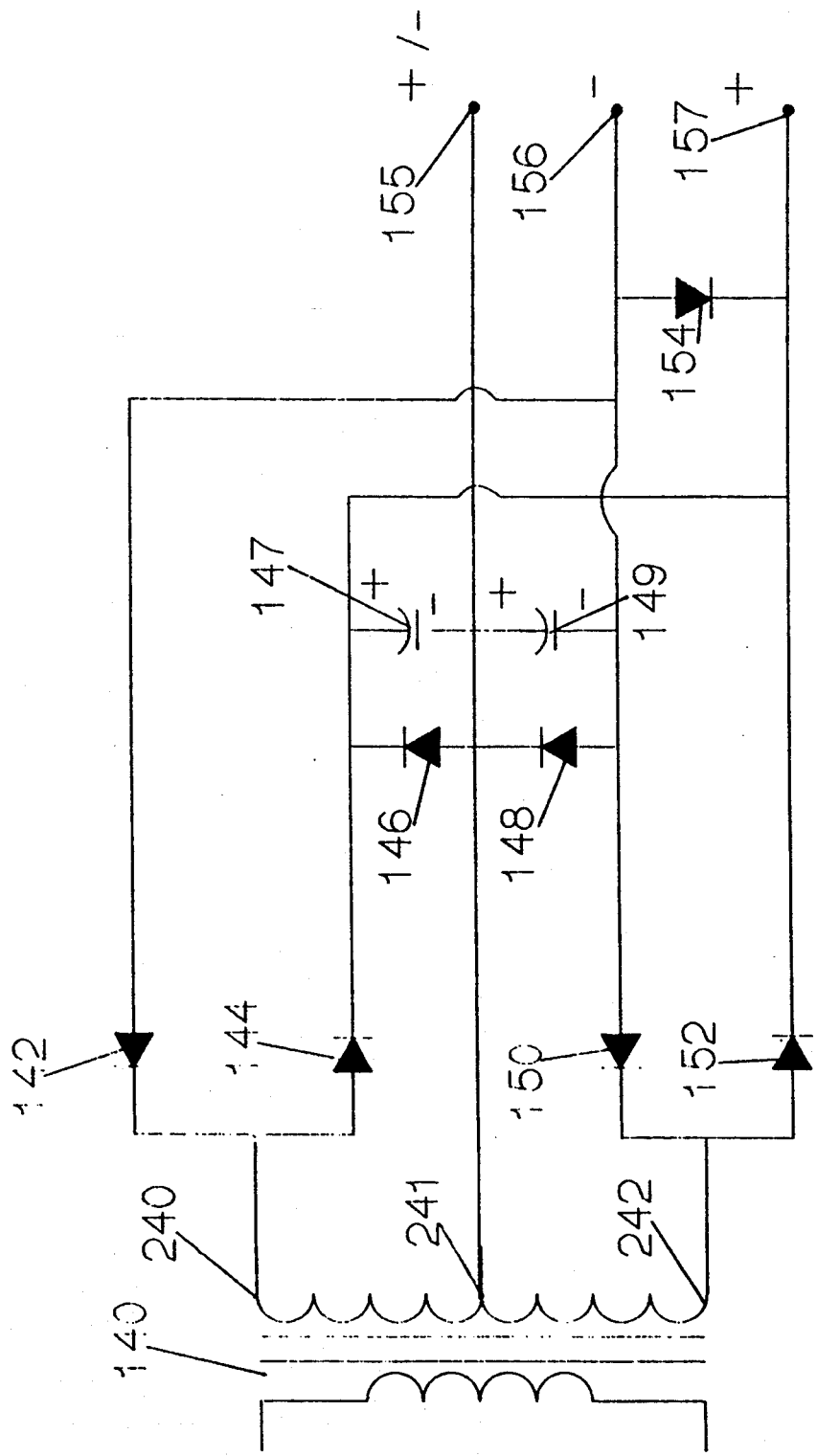
FIG. 13 is a schematic drawing of another embodiment of a power supply of the invention.
Figure 14:
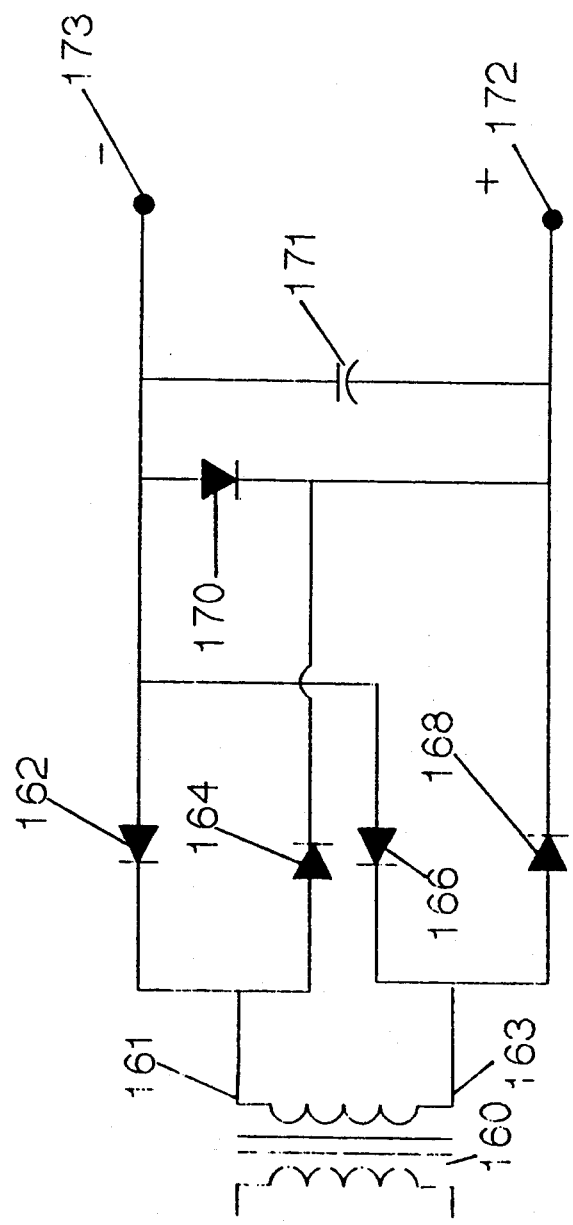
FIG. 14 is a schematic drawing of another embodiment of a power supply of the invention.

The inventor has produced three other designs for power supplies that are not quite as effective in reducing distortion in the ground loop problem as the above designs. FIGS. 12, 13 and 14 show power supplies that help eliminate the ground loop problem. However, these circuits are not as effective as those described above. FIG. 12 shows a transformer 200 with out puts 201 and 205 and center tap 203. Diode 202 negative end is attached to output 201 of transformer 200. Diode 202 positive end is attached to the positive output 212 of the power supply, the positive end of diode 210 and the positive end of electrolytic capacitor 211. Diode 204 negative end is attached to center tap 203; its positive end is attached to the other positive output 216 of the power supply, the positive end of diode 208 and the positive end of capacitor 207. Diode 206 positive end is attached to output 205 of the transformer 200; diode 206 negative end is attached to the negative end of capacitor 207 the negative end of diode 208 the negative end of diode 210 and the negative end of capacitor 211 and the negative output 214. Electrolytic capacitor 207 positive end is attached to the positive end of diode 208 and the negative end of diode 206. Diode 208 positive end is attached to one of the positive output of 216 of the power supply, the positive end of diode 207 and the positive end of diode 204. Diode 208 negative end is attached to the negative end of diode 206, 210 and the negative end of capacitors 207 and 211. Diode 210 positive end is attached to the positive end of diode 202, the positive end of capacitor 211 and the positive output 212 of the power supply. Diode 210 negative end is attached to the negative end of diode 206, the negative end of capacitor 208, the negative end of capacitor 207, the negative end of capacitor 211, and the negative output, 214 of the power supply. Capacitor 211 positive end is attached to the positive end of diode 210 and 202 and the one of the positive output 212. Capacitor 211 negative end is attached to the negative output of the power supply and the negative ends of diode 210, 208 and 206 and the negative end of capacitor 207. Another full wave power supply is shown in FIG. 13. In this figure transformer 140 has out puts 240 and 242 and center tap 241. Output 240 is attached to the positive end of diode 142 and the negative end of diode 144. The negative end of diode 142 is attached to the negative output of the power supply and the negative ends of diode 154, 150 and 148 and the negative end of electrolyte capacitor 149. The positive end of diode 144 is attached to the positive ends of diode 146, 152, and 154 and the positive output 157 of the power supply. The positive end of diode 146 is attached to the positive end of diode 144, 152 and 154 and the positive output 157 of the power supply and the positive end of capacitor 147. Diode 146 negative end is attached to the negative end of capacitor 147, the positive end of capacitor 149, the positive end of diode 148 and the ground for plus minus output 155 of the power supply. The positive end of diode 148 is attached to center tap 241 and the negative end of diode 146 and the negative end of capacitor 147 and the positive end of capacitor 149 and the plus minus output 155 of the power supply. The negative end of diode 148 is attached to the negative end of diodes 150 and 154 the negative output 156 of the power supply, and the negative end of capacitor 149. Output 242 of transformer 140 is attached to the positive end of diode 150 and the negative end of diode 152. The negative end of diode 150 is attached to the negative end of diode 148 the negative end of capacitor 149 the negative end of diode 154 and the negative output of the power supply 156. The positive end of diode 152 is attached to the positive end of diode 146, 144, 154 and the positive end of capacitor 147 and the positive output 157.

FIG. 14 shows another embodiment of the invention in which transformer 160 does not have a center tap. Transformer 160 has out puts 161 and 163. Output 161 is attached to the negative end of diode 164 and the positive end of diode 162. The negative end of diode 162 is attached to the negative end of diode 166, 170 and the negative output 173. The positive end of diode 164 is attached to the positive end of diode 170 and the positive end of diode 168 and the positive output 172 of the power supply. Diode 170 negative end is attached to the negative end of diode 162, the negative end of 166 and the negative output 173 of the power supply. Diode 170 positive end is attached to the positive end of diode 164 and the positive end of diode 168 and the positive output 172 of the power supply. Transformer 160 other output 163 is attached to the positive end of diode 166 and the negative end of diode 168. The negative end of diode 166 is attached to the negative end of diode 162 and the diode 170 and the negative output 173. The positive end of diode 168 is attached to the positive end diode 164, and 170 and the positive output 172. A capacitor 171 is ran across the positive output 172 and the negative output 173.

Figure 15:
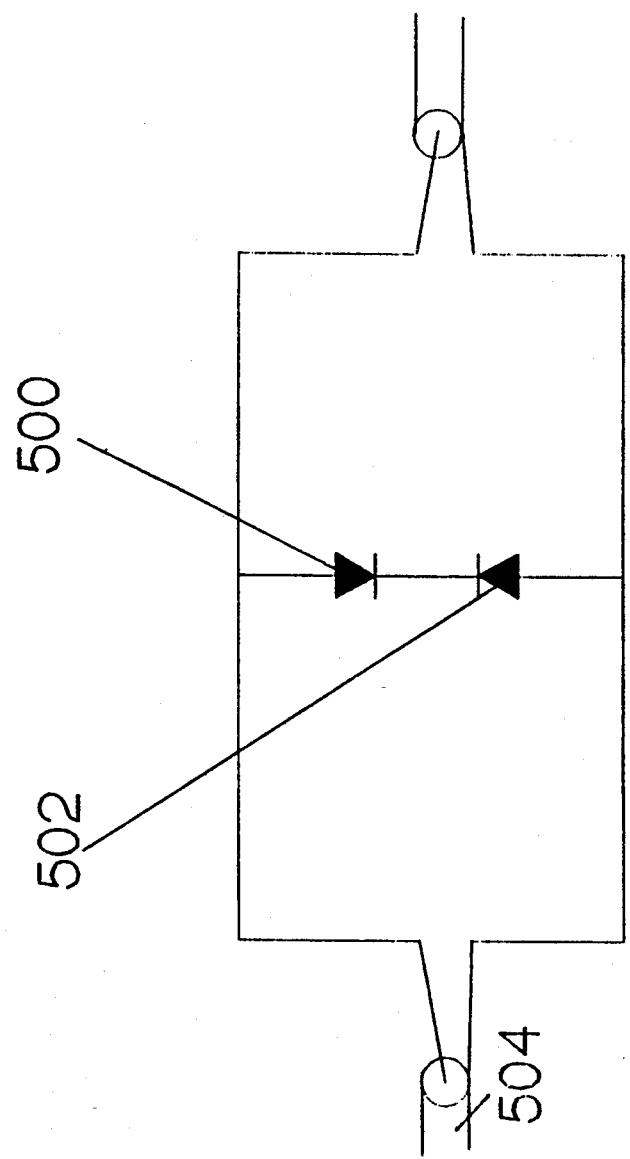
FIG. 15 is a schematic drawing of diodes attached between a cable and the cable's ground.
Figure 16:
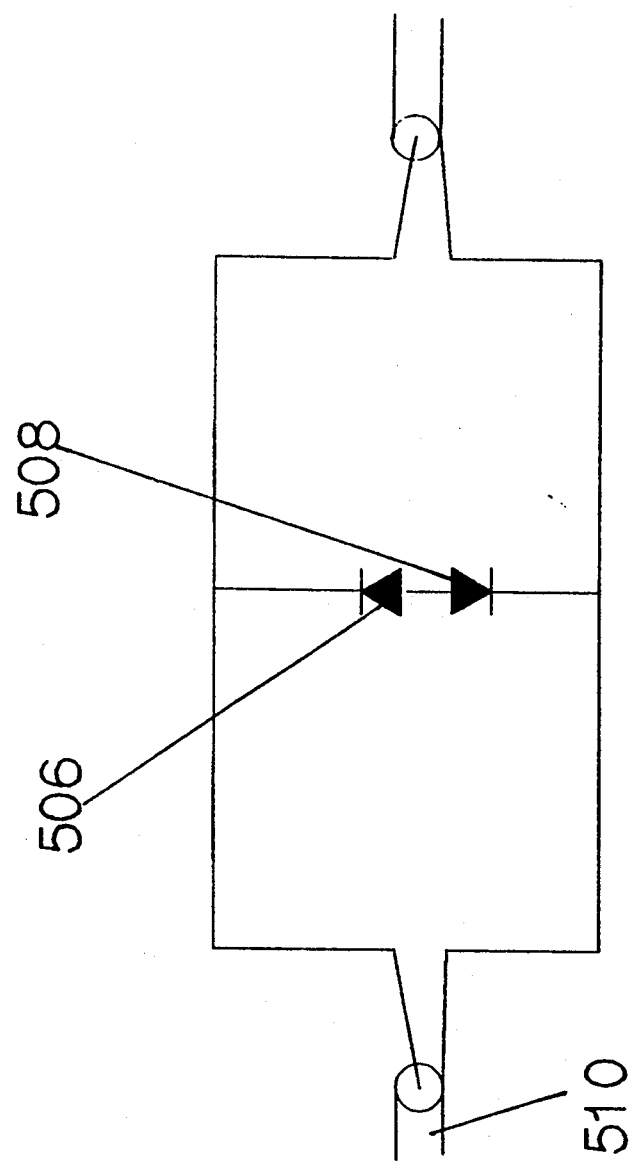
FIG. 16 is a schematic drawing of another embodiment of the invention with diodes attached between the cable and the cable's ground.
Figure 17:
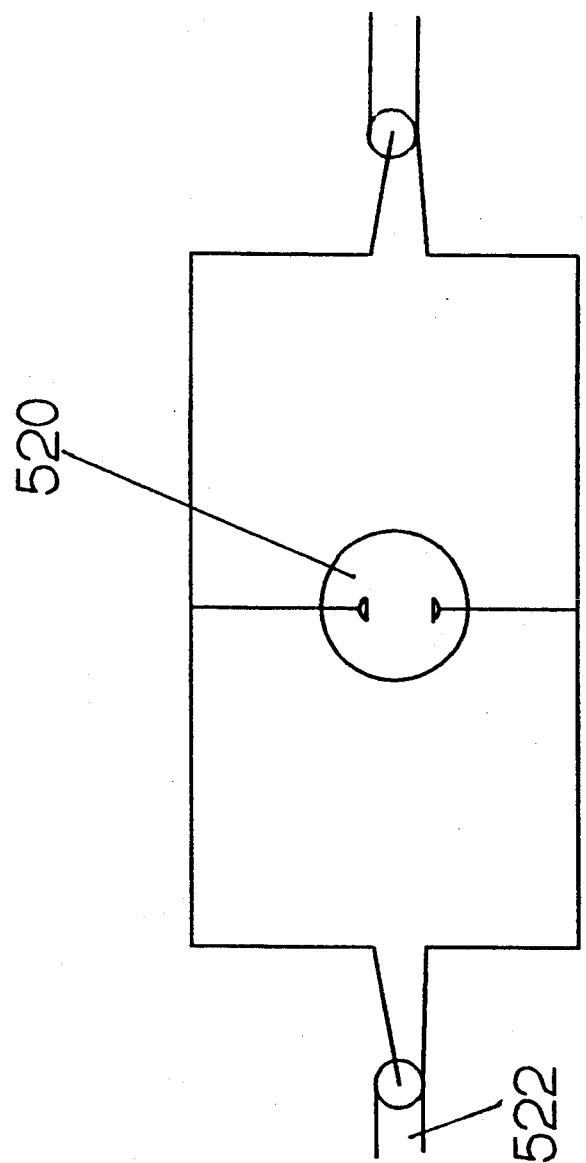
FIG. 17 is a schematic with neon bulbs attached between a cable and the cable's ground.

The applicant has also found that diodes, neon bulbs, and piezoelectric crystals can reduce distortion when attached in parallel to audio and video cables. FIG. 15, 16, 17, and 18 shows these embodiments of the invention. In FIG. 15 diodes 500 and 502 are attached cathode to cathode. These diodes are attached in parallel across cable 504. In FIG. 16 diodes 506 and 508 are attached anode to anode, and are attached in parallel with cable 510. By attaching the diodes in parallel with the cable, the applicant has solved the ground loop problem of the cable and has greatly reduced the distortion in the cable. The applicant further states that a neon bulb 520 as shown in FIG. 17 can be attached in parallel with a cable 522 and reduce the distortion of the cable. Neon bulbs work well but not as well as the diodes shown in FIG. 15 and 16. Also a piezoelectric crystals 530 with a frequency of under 400 kilohertz can be attached in parallel with the cable 532 as shown in FIG. 18, The piezoelectric crystal 530 will reduce distortion of the cable. However, it does not do as well as the diodes of 15 and 16 nor as well as the neon bulb in FIG. 17.

Changes and modification in specifically described embodiment can be carried out without departing from the scope of the invention which is intended to be limited only by the scope by the appending claims.

I claim:

1. A power supply comprising:
 a. a transformer with a first and a second output, b. a first diode whose positive terminal is attached to the transformer first output and said first diode has a negative terminal;

c. a second diode whose negative terminal is attached to the transformer first output and said second diode has a positive terminal;

d. a third diode whose positive end is attached to the transformer second output and said third diode has a negative terminal;

e. a fourth diode whose negative end is attached to the transformer second output and said forth diode has a positive terminal;

f. a fifth diode whose negative terminal is attached to the negative terminal of the first diode and whose positive terminal is attached to the positive terminal of the second and fourth diodes;

g. a negative output of the power supply attached to the negative terminal of the first and fifth diodes;

h. a positive output of the power supply attached to the positive terminal of the second, fourth and fifth diodes; and, i. a capacitor attached to the negative and positive outputs of the power supply.

2. A power supply which reduces distortion comprising:

a. a transformer with first and second outputs and a center tap;

b. a first diode with negative and positive terminals and whose positive terminals is attached to the first output of the transformer;

c. a second diode with positive and negative terminals and whose positive terminal is attached to the second output of the transformer and said second diode is attached with the same bias as the first diode whereby the current will only flow through the first and second diode in the same direction;

d. a third diode with negative and positive terminals whose negative terminal is attached to the negative terminal of the first diode and whose positive terminal is attached to the center tap;

e. an electrolyte capacitor with its negative terminal attached to the negative terminal of the third diode and its positive terminal attached to the positive terminal of the third diode;

f. a first output of the power supply attached to the center tap and the positive terminal of the third diode; and, g. a second output of the power supply attached to the negative terminals of the first and second diode.

3. A power supply which reduces distortion as in claim 2 further comprising:

a. a bipolar capacitor attached between the first output of the transformer and the center tap.

4. A power supply which reduces distortion comprising:

a. a transformer with first and second outputs and a center tap;

b. a first diode with a positive and negative terminal whose positive terminal is attached to the first output of the transformer;

c. a second diode with a positive and negative terminal whose negative terminal is attached to the second output of the transformer;

d. a third diode with a negative terminal and a positive terminal attached between the negative terminal of the first diode and the center tap;

e. a fourth diode with a negative terminal and a positive terminal attached between the positive terminal of the second diode and the center tap forming a series circuit of the third and fourth diodes;

f. a first electrolytic capacitor attached in parallel with the third diode with its positive terminal attached to the positive terminal of the third diode and its negative terminal attached to the negative terminal of the third diode;

g. a second electrolytic capacitor attached in parallel with the fourth diode with its negative terminal attached to the negative terminal of the fourth diode and its positive terminal attached to the positive terminal of the fourth diode forming a series circuit of the first and second capacitor and the series circuit of the first and second capacitor form a parallel connection with the series circuit of the third and fourth diodes;

h. a fifth diode attached across the parallel connection of the series circuits of the third diode and fourth diode and first capacitor and second capacitor;

i. a first output of the power supply attached to the positive terminals of the second, fourth and fifth diodes;

j. a second output of the power supply attached to the negative terminals of the first, third and fifth diodes;

k. a capacitor attached in parallel to the fifth diode; and, l. a neutral output attached to the center tap and the positive terminal of the third and the negative terminal of the fourth diodes.

5. A power supply as in claim 4 further comprising:

a. bipolar capacitor attached to the outputs of the transformer before the first and second diodes.

6. A power supply comprising:

a. a transformer with first and second outputs and a center tap;

b. a first bipolar capacitor attached across the first and second transformer outputs;

c. a second bipolar capacitor attached between the center tap and the second transformer output;

d. a first diode with a positive terminal which is attached to the center tap;

e. a first positive output of the power supply attached to the positive terminal of the first diode;

f. a second diode with a positive and negative terminal whose positive terminal is attached to the positive terminal of the first diode and the first positive output;

g. a first electrolytic capacitor in parallel with the second diode whose positive terminal is attached to the positive terminal of the second diode and whose negative terminal is attached to the negative terminal of the second diode;

h. a third diode whose positive terminal is attached to the second output of the transformer and whose negative terminal is attached to the negative terminal of the second diode;

i. a fourth diode whose positive terminal is attached to the first output of the transformer and whose negative terminal is attached to the negative terminal of the second and third diodes;

j. a second electrolytic capacitor attached in parallel to the fourth diode and whose positive terminal is attached to the positive terminal of the fourth diode and whose negative terminal is attached to the negative terminal of the fourth diode;

k. a second positive output of the power supply which is attached to the second output of the transformer and the positive terminal of the fourth diode; and, l. a negative output of the power supply which is attached to the negative terminal of the second, third and fourth diodes.

7. A power supply which lowers distortion comprising:

a. a transformer with first and second outputs and a center tap;

b. a first diode whose negative terminal is attached to the first output of the transformer and said first diode has a positive terminal;

c. a second diode whose negative terminal is attached to the center tap and said second diode has a positive terminal;

d. a first positive output of the power supply attached to the positive terminal of the second diode;

e. a third diode whose positive terminal is attached to the second output of the transformer and said third diode has a negative terminal;

f. a fourth diode whose negative terminal is attached to the negative terminal of the third diode and whose positive terminal is attached to the first positive output of the power supply;

g. a first electrolytic capacitor that is attached in parallel with the fourth diode whose positive terminal is attached to the positive terminal of the fourth diode and whose negative terminal is attached to the negative terminal of the fourth diode;

h. a fifth diode whose positive terminal is attached to the positive terminal of the first diode and whose negative terminal is attached to the negative terminals of the third and fourth diodes;

i. a second electrolytic capacitor which is in parallel with the fifth diode and whose positive terminal is attached to the positive terminal of the fifth diode and whose negative terminal is attached to the negative terminal of the fifth diode;

j. a negative output of the power supply attached to the negative terminal of the third, fourth, and fifth diodes; and, k. a second positive output of the power supply attached to the positive terminals of the first and fifth diodes.

8. A power supply comprising:

a. a transformer with a first and a second output and a center tap;

b. a first diode whose positive terminal is attached to the first output of the transformer and said first diode has a negative terminal;

c. a second diode whose negative terminal is attached to the first output of the transformer and the positive terminal of the first diode and said second diode has a positive terminal;

d. a third diode whose positive terminal is attached to the positive terminal of the second diode and whose negative terminal is attached to the center tap;

e. a first electrolytic capacitor in parallel with the third diode whose positive terminal is attached to the positive terminal of the third diode and whose negative terminal is attached to the negative terminal of the third diode;

f. a fourth diode whose negative terminal is attached to the second output of the transformer and said fourth diode has a positive terminal;

g. a fifth diode whose positive terminal is attached to the second output of the transformer and the negative terminal of the fourth diode and said fifth diode has a negative terminal;

h. a sixth diode whose negative terminal is attached to the negative terminal of the fifth diode and whose positive terminal is attached to the negative terminal of the third diode and the center tap;

i. a second electrolytic capacitor in parallel with the sixth diode whose positive terminal is attached to the positive terminal of the sixth diode and whose negative terminal is attached to the negative terminal of the sixth diode;

j. a neutral output of the power supply attached to the center tap of the transformer and the negative terminal of the third diode and the positive terminal of the sixth diode;

k. a negative output of the power supply attached to the negative terminal of the fifth and sixth diodes;

l. a positive output of the power supply is attached to the positive terminal of the second, third and fourth diodes; and, m. a seventh diode whose negative terminal is attached to the negative output of the power supply and the negative terminal of the fifth and sixth diodes and whose positive terminal is attached to the positive terminal of the second, third and fourth diode and the positive output of the power supply.

9. A power supply which reduces distortion comprising:

a. a transformer with a first and second output and a center tap;

b. a first diode with negative and positive terminals and whose negative terminals is attached to the first output of the transformer;

c. a second diode with a negative terminal is attached to the second output of the transformer and said second diode is attached with the same bias as the first diode whereby the current will only flow through the first and second diodes in the same direction;

d. a third diode with a negative and a positive terminal and whose positive terminal is attached to the positive terminal of the first diode and whose negative terminal is attached to the center tap;

e. an electrolytic capacitor with a negative terminal attached to the negative terminal of the third diode and a positive terminal attached to the positive terminal of the third diode;

f. a first output of the power supply attached to the center tap and the negative third diode; and, g. a second output of the power supply attached to the positive terminal of the first and second diodes.

10. A power supply which reduces distortion as in claim 9 further comprising:

a. a bipolar capacitor attached between the first output of the transformer and the center tap.

* * * * *